(12) United States Patent
Terryn

(10) Patent No.: US 7,965,728 B2
(45) Date of Patent: Jun. 21, 2011

(54) BUFFER FOR DRIVING CAPACITIVE LOAD

(75) Inventor: Steven Terryn, Denderleeuw (BE)

(73) Assignee: ST-Ericsson SA, Geneva (CH)

( * ) Notice: Subject to any disclaimer, the term of this patent is extended or adjusted under 35 U.S.C. 154(b) by 1226 days.

(21) Appl. No.: 11/599,178

(22) Filed: Nov. 14, 2006

(65) Prior Publication Data
US 2008/0111590 A1    May 15, 2008

(51) Int. Cl.
*H03K 3/00* (2006.01)
(52) U.S. Cl. ........ 370/413; 455/313; 455/259; 455/326; 455/334; 327/65; 327/112; 327/118; 327/127
(58) Field of Classification Search .................. 370/413; 455/259, 313; 327/112, 118, 127
See application file for complete search history.

(56) References Cited

U.S. PATENT DOCUMENTS

| | | | | |
|---|---|---|---|---|
| 4,802,127 | A * | 1/1989 | Akaogi et al. | 365/189.05 |
| 5,995,819 | A * | 11/1999 | Yamaji et al. | 455/326 |
| 6,278,294 | B1 * | 8/2001 | Taniguchi | 326/80 |
| 2003/0013428 | A1 * | 1/2003 | Marques et al. | 455/259 |
| 2005/0186935 | A1 * | 8/2005 | Kawama et al. | 455/334 |
| 2007/0010228 | A1 * | 1/2007 | Schelmbauer et al. | 455/313 |

* cited by examiner

*Primary Examiner* — Robert W Wilson
*Assistant Examiner* — Mohamed Kamara

(57) ABSTRACT

A buffer circuit buffers incoming signals, from a local oscillator generator to a mixing circuit and has a push-pull circuit having two inputs, a first being coupled to a first incoming signal, and a second of the inputs being coupled to one of the buffered versions of the incoming signals, having a phase related to that of the first incoming signal. By coupling a second input to a buffered version rather than to the incoming signal, the load presented to the preceding circuit can be halved, while maintaining reduced power consumption. By using as a second input, a signal which is phase related to the first incoming signal, the normal operation of the push-pull circuit can be maintained. The incoming signals from the LO generator can be differential IQ signals and the buffered version of the further incoming signal be in phase with the first incoming signal.

37 Claims, 2 Drawing Sheets

BUFFER FOR DRIVING CAPACITIVE LOAD

FIELD OF THE INVENTION

This invention relates to analog drivers or buffer circuits, to mixers and transceivers having such analog drivers or buffer circuits, and to corresponding methods of operating or manufacturing such circuits and devices.

DISCUSSION OF THE RELATED ART

A mixer performs a multiplication of two input signals (A at frequency $f_A$ and B at $f_B$) resulting in an output signal C at $f_A+/-f_B$. Depending on the frequency nature of the input and output signals, up-conversion and down-conversion mixers can be distinguished. In a down-conversion structure two high frequency signals (Local Oscillator LO and Radio Frequency RF) are the input signals resulting in a low frequency (Intermediate Frequency IF or Low Frequency LF) output. This is used in receiver structures. In an up-conversion mixer, as used in transmitters, the output is the high frequency RF signal and the low frequency LF is an input.

It is known to have a buffer to drive the LO input of the mixer, which appears as a capacitive load at RF frequencies. The buffer amplifies the 4 phases of a local oscillator (LO) signal, meaning I & Q, both differential signals. These signals are the signals driving the mixers in transmitter or receiver chains to get single sideband mixing. The buffer buffers the mixer circuits (and the capacitive load they're representing) from the preceding LO generator circuit that generates the 4-phase signals. This generator can be typically a divide-by-2 or a polyphase filter.

The buffer can be a class A or class B amplifier arrangement. A class A typically has high power consumption, while a class B uses less power but shows a higher capacitive load to the preceding circuit, and so causes higher power consumption in the LO generator circuit.

U.S. Pat. No. 6,147,543 shows an example of a mixer circuit for RF applications and having a differential LO input buffer circuit.

SUMMARY OF THE INVENTION

An object of the invention is to provide improved analog driver or buffer circuits, mixers and transceivers having such analog drivers or buffer circuits, and corresponding methods of operating or manufacturing such circuits and devices. According to a first aspect, the invention provides:

An analog buffer circuit arranged to receive a first incoming signal and one or more further incoming signals, to output buffered versions of the signals, the buffer circuit having: a first circuit arranged to receive the first incoming signal and output a first buffered version, and one or more further circuits for receiving the further incoming signal or signals and outputting corresponding further buffered versions, the first circuit having a push-pull circuit having two or more inputs, a first of the inputs being coupled to the first incoming signal, and a second of the inputs of the first circuit being coupled to one of the further buffered signals having a phase related to that of the first incoming signal.

By coupling a second input to a buffered signal rather than both of the inputs being coupled to the incoming signal, the load presented to the preceding circuit can be halved, while maintaining the advantages of push-pull circuits, such as reduced power consumption. By using as a second input, a signal phase related to the first incoming signal, the normal operation of the push-pull circuit can be maintained.

Other aspects of the invention provide a mixer or an RF transceiver having a local oscillator, a mixer and one or more buffer circuits as set out above.

Other aspects of the invention include corresponding methods of buffering using the buffer circuit, or methods of manufacturing the buffer circuit. The buffer circuit is particularly useful when implemented in CMOS technology.

For example, in another aspect of the present invention a method of operating an analog buffer circuit is provided, the method comprising:

receiving a first incoming signal (Ip) at a circuit, the circuit having a push-pull circuit (T2,T3) having two or more inputs;

receiving one or more further incoming signals (Qp,In, Qn), inputting the first incoming signal (Ip in) at a first of the inputs and inputting one of the further buffered versions (Qp out) having a phase related to that of the first incoming signal to a second of the inputs, and outputting buffered versions (Ip out, Qp out,In out, Qn out) of the incoming signals.

Some additional optional features are described below, many others can be envisaged within the scope of the claims. Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

DETAILED DESCRIPTION

How the present invention may be put into effect will now be described by way of example with reference to the appended drawings, in which.

DESCRIPTION OF THE PREFERRED EMBODIMENTS

The present invention will be described with reference to certain drawings and to certain embodiments but this description is by way of example only.

Embodiments of the invention are concerned with implementing the buffer function, e.g. as a buffer circuit or analog driver, in a more power-efficient way, for example for use in LO IQ buffers, or other applications, especially when power consumption of neighboring circuits in the chain is taken into account such as in mixers and transceivers having such buffer circuits. For example any of IQ-generating circuit, buffers and mixers could be neighboring circuits. By way of introduction to the description of embodiments of the invention, principles of known solutions and their disadvantages will be discussed for reference.

Figure 1:
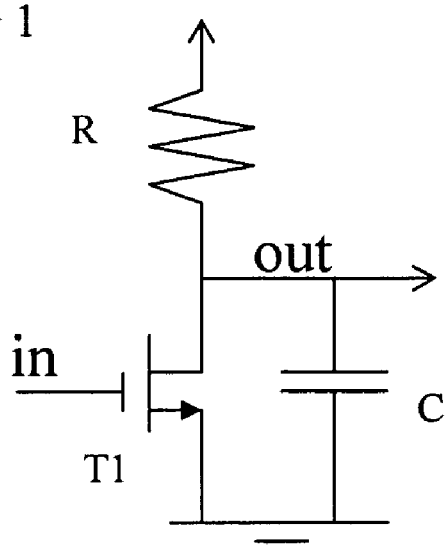
FIGS. 1 and 2 show simplified schematics of circuits for reference.
Figure 2:
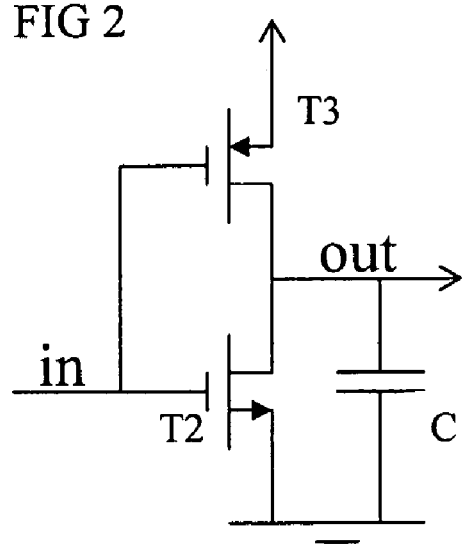

Two possible buffers are shown in FIGS. 1 and 2. Both are simplified schematics to show the principle of operation. They are without biasing structures and both would or could be implemented in practice in a somewhat changed form.

FIG. 1 represents a generic class A amplifier, which suffers from low power efficiency, meaning that a current is wasted. Optionally, a coil can be added in parallel with the capacitive load to realize resonance at the desired frequency, but a coil also costs a lot of chip area, especially in the considered case where four LO signals have to be buffered.

FIG. 2 is another simplified schematic representing a generic class B amplifier, having a higher power efficiency, since now the DC-current can be significantly less than the current delivered to the capacitive load. However, this circuit also presents a higher capacitive load to the preceding IQ-generation circuits, namely the gate capacitance of both N- and PMOS input transistors, with the PMOS adding a lot of capacitance, since it has to be bigger in area for the same drive capability. This higher capacitive load for the preceding circuit, causes a rise in the current consumption of these circuits.

Aspects and advantages of embodiments of the invention will now be explained. A first embodiment has a circuit arranged to operate as a push-pull circuit in class B mode and has a lower current consumption. The push-pull function can be implemented as any type of push-pull circuit having two or more inputs, and so encompasses any type of class B mode including variants such as Class AB for example. A buffer circuit also presents a low capacitive load to the preceding circuits. For example when implemented in CMOS technology, the capacitive load to the preceding circuits is only the gate capacitance of the NMOS transistor, as in the class A circuits. It can thus improve on other solutions, such as the reference circuits of FIGS. 1 and 2, particularly when considering power consumption of the complete LO chain.

Figure 3:
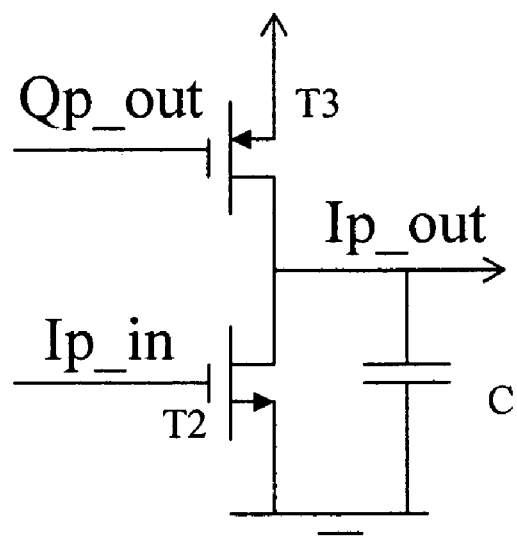
FIG. 3 shows a first embodiment of the invention.
Figure 4:
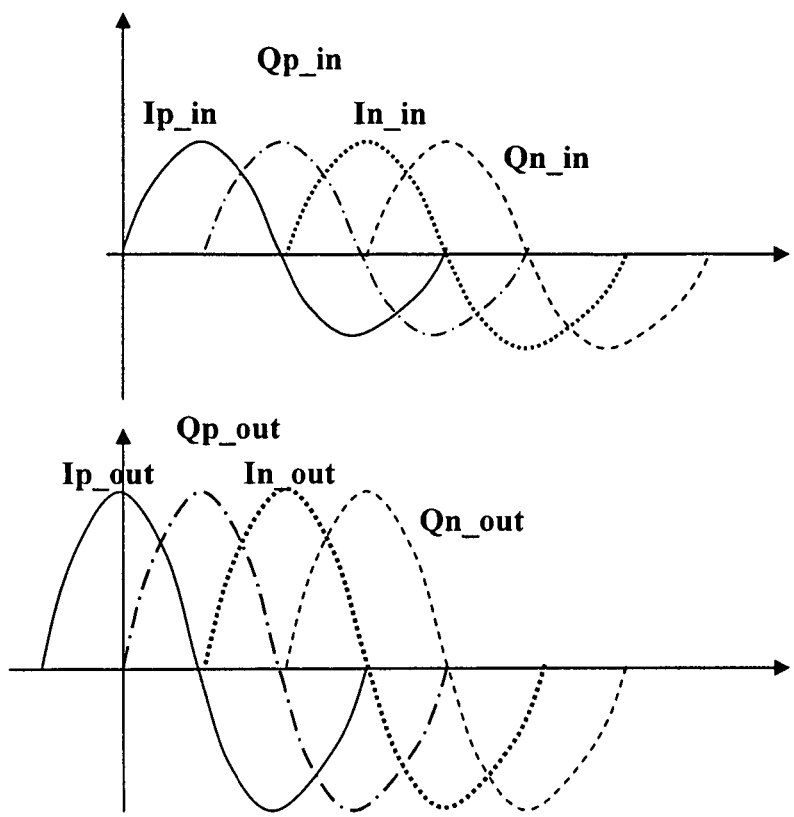
FIG. 4 shows graphs of input and output signals.
Figure 5:
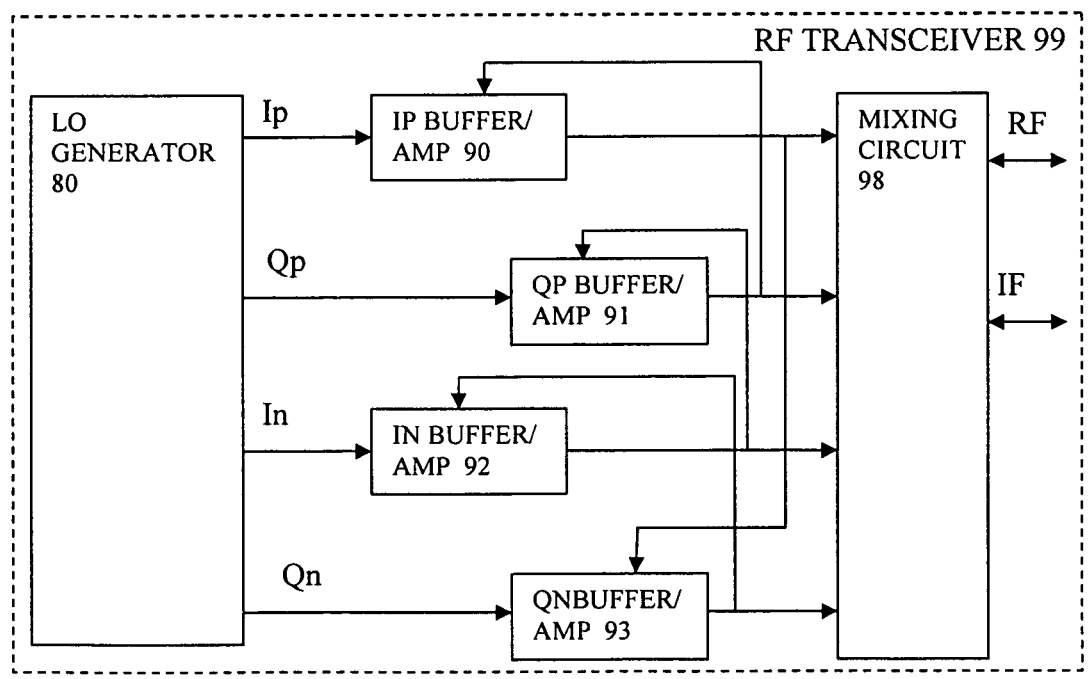
FIG. 5 shows an overall schematic of an embodiment having a chain with four amplifiers.

An example of a circuit according to a first embodiment is presented in FIG. 3, which shows one of the four LO buffers as shown for example in FIG. 5. The buffer includes two transistors T2 and T3 that can be a pair of PMOS/NMOS transistors constructed in CMOS technology. Owing to the fact that the output of this buffer has a phase shift of around 90° with respect to the input as the load is purely capacitive, the output of one of the three other buffers (i.e. a Qp_out) will be in phase with the input (Ip_in). This means that the PMOS transistor T3 of the buffer of FIG. 3 can be driven by the output of the relevant one of the other buffers and does not present a capacitive load at the input (see FIG. 5 for the connections between the buffers). The timing of input and output signals is drawn in FIG. 4.

Referring to FIG. 4, the Qn-out or Qp_out signal of the relevant first one of the buffer circuits of the type shown 5 and 3 is in phase with the In_in signal or Ip_in signal of the other one of the buffer circuits, respectively thus allowing to use the Qn-out or Qp_out signal as the driving signal for the PMOS transistor T3 of the other one of the buffer circuits. In implementing such a circuit, the stability should be considered, i.e. the stability generated by this feedback of signals. The feedback from output of one buffer to input of another buffer creates a loop over the 4 buffers, which might become unstable if not dealt with, i.e. controlled or limited. One way to deal with this is to change the circuit so that the stages are not DC-coupled to each other as in the schematic of FIG. 3, but use an AC-coupling such as a coupling capacitor which can enable more flexibility to ensure better stability However, the use of a coupling capacitor is optional and does not make any difference to the basic operating principle of the present invention.

FIG. 5 shows an overall schematic of an embodiment having part of a chain with four buffers 90, 91, 92, 93 between a first circuit such as an LO generator 80 and a second circuit such as a mixing circuit 98. The present invention is not limited to this arrangement and is not limited to the use of mixing circuits. The present invention may also be used for other buffering applications, e.g. buffering of low frequency I & Q signals, where the preceding and following stages are different. The buffers 90, 91, 92, 93 and the mixing circuit 98 can be regarded as a mixer. The LO generator 80 generates two pairs of differential signals, I and Q which are in quadrature. The I pair has positive and negative signals Ip and In, and the Q pair has positive and negative signals Qp and Qn. A first buffer 90 can be implemented as shown in FIG. 3, as can each of the three further buffers. Each of the buffers can therefore include a PMOS and an NMOS transistor (e.g. made in CMOS technology) having a common output signal. The first buffer has two inputs, one coupled to Ip, and the other to the buffered version of Qp, output by buffer 91. Similarly second buffer 91 has two inputs, one coupled to Qp and the other to the buffered version of In, output by the third buffer 92. Similarly, the third buffer 92 has two inputs, the first coupled to In, and the second input to the buffered version of Qn, output by the fourth buffer 93. Similarly, the fourth buffer has two inputs, a first coupled to Qn and a second input coupled to the buffered version of Ip, output by the first buffer. As shown, the mixer, LO and buffers can be part of an RF transceiver 99 having RF and IF signals input to and/or output by the mixing circuit. Of course they can be part of a receiver or a transmitter.

As has been described, a buffer circuit buffers incoming signals (Ip, Qp, In, Qn) from a first circuit, e.g. from a local oscillator generator (80) to a further circuit such as a mixing circuit (98) and each buffer circuit has a push-pull circuit (T2,T3) having two inputs, a first being coupled to a first incoming signal (Ip in), and a second of the inputs being coupled to one of the buffered versions of the outgoing signals (Qp out), having a phase related to that of the first incoming signal. By coupling a second input to a buffered version of an output rather than to the incoming signal, the load presented to the preceding circuit can be halved, while maintaining reduced power consumption. By using a second input, a signal which is phase related to the first incoming signal, the normal operation of the push-pull circuit can be maintained. The incoming signals from the LO generator can be differential IQ signals.

Some of the embodiments have optional additional features such as the further incoming signal being in quadrature with the first incoming signal, and the buffered version of the further incoming signal being in phase with the first incoming signal. Another such feature is the push-pull circuit comprising a pair of complementary transistors, one coupled to drive an output to a first supply voltage, and another coupled to drive an output to a second supply voltage. Another such feature is the buffer circuit having three of the further circuits, and being arranged to receive two pairs of differential incoming signals, the two pairs being in quadrature. Another such feature is a given one of the further circuits having a further push-pull circuit, the buffered version of the first incoming signal being coupled to a second input of the further push-pull circuit. Another such feature is the buffered version of the further input being AC-coupled to the second input. Another such feature is the buffer circuit being formed as part of an integrated circuit. Another such feature is the integrated circuit being suitable for RF signals.

In principle the buffered version fed back to the second input could be out of phase with the corresponding incoming signal, if the second input is an inverting input for example. The buffer circuit can be implemented in discrete components or in integrated circuit form using CMOS, BiCMOS or any other semiconductor technology as appropriate for the application. In principle, circuits for any frequency range can use the buffers, including sub RF, RF and microwave frequencies for example.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A buffer circuit arranged to receive a first incoming signal and one or more further incoming signals and to output buffered versions of the incoming signals, the buffer circuit comprising:
    a first circuit arranged to receive the first incoming signal and output a first buffered version, and
    one or more further circuits each for receiving a signal the one or more further incoming signals and outputting corresponding one or more further buffered versions,
    the first circuit having a push-pull circuit having two or more inputs, a first of the inputs being coupled to the first incoming signal and a second of the inputs of the first circuit being coupled to a first further buffered version of the one or more further buffered versions that is in phase with the first incoming signal.

2. The buffer circuit of claim 1, wherein the first further buffered version is output from a first further circuit of the one or more further circuits, the first further circuit receiving a second incoming signal of the one or more further incoming signals, the second incoming signal being in quadrature with the first incoming signal.

3. The buffer circuit of claim 1, the push-pull circuit comprising a pair of complementary transistors, one being coupled to drive an output to a first supply voltage, and another coupled to drive an output to a second supply voltage.

4. The buffer circuit of claim 1, having three of the further circuits and being arranged to receive two pairs of differential incoming signals, the two pairs being in quadrature with one another.

5. The buffer circuit of claim 1, a given one of the further circuits having a further push-pull circuit, the first buffered version being coupled to a second input of the further push-pull circuit.

6. The buffer circuit of claim 1, the buffered version of the further input being AC-coupled to the second input.

7. The buffer circuit of claim 1, the buffer circuit being formed as part of an integrated circuit.

8. A mixer comprising:
    a mixing circuit; and
    one or more buffer circuits for buffering a local oscillator input to the mixer, at least one buffer circuit comprising:
    a buffer arranged to receive a first incoming signal and one or more further incoming signals and to output buffered versions of the incoming signals, the buffer having:
    a first circuit arranged to receive the first incoming signal and output a first buffered version, and
    one or more further circuits each for receiving a signal the one or more further incoming signals and outputting corresponding further buffered versions,
    the first circuit having a push-pull circuit having two or more inputs, a first of the inputs being coupled to the first incoming signal and a second of the inputs of the first circuit being coupled to a particular further buffered version of the one or more further buffered versions that is in phase with the first incoming signal.

9. The mixer of claim 8, wherein the particular further buffered version is output from a particular further circuit of the one or more further circuits, the particular further circuit receiving a particular further incoming signal of the one or more further incoming signals, the particular further incoming signal being in quadrature with the first incoming signal.

10. The mixer of claim 8, the push-pull circuit comprising a pair of complementary transistors, one being coupled to drive an output to a first supply voltage, and another coupled to drive an output to a second supply voltage.

11. The mixer of claim 8, the analog buffer having three of the further circuits, and being arranged to receive two pairs of differential incoming signals, the two pairs being in quadrature with one another.

12. The mixer of claim 8, a given one of the further circuits having a further push-pull circuit, the first buffered version being coupled to a second input of the further push-pull circuit.

13. The mixer of claim 8, the buffered version of the further input being AC-coupled to the second input.

14. The mixer of claim 8, the analog buffer being formed as part of an integrated circuit.

15. An RF transceiver having the mixer of claim 8 and a local oscillator generator.

16. A method of operating a buffer circuit, the method comprising:
    receiving a first incoming signal and a second incoming signal at a first buffer circuit, the first buffer circuit having a push-pull circuit having two or more inputs, the first incoming signal being received at a first of the inputs and the second incoming signal being received at a second of the inputs, the second incoming signal being in phase with the first incoming signal; and
    outputting from the first buffer circuit a buffered version of the first incoming signal.

17. The method of claim 16, wherein outputting from the first buffer circuit the buffered version of the first incoming signal comprises outputting a buffered version that is in quadrature with the first incoming signal.

18. The method of claim 16, wherein receiving the second incoming signal comprises receiving the second incoming signal from a second buffer circuit, the second buffer circuit outputting the second incoming signal as a buffered version of a third signal, the third signal being in quadrature with the first incoming signal.

19. The method of claim 18, wherein the first incoming signal and the third signal are in-phase and quadrature components of an original signal.

20. The buffer circuit of claim 2, wherein the first further circuit comprises a push-pull circuit having two inputs, a first of the inputs being coupled to the second incoming signal that is in quadrature with the first incoming signal and a second of the inputs being coupled to a second further buffered version of the one or more further buffered versions, the second further buffered version being in phase with the second incoming signal,
    wherein the first further circuit outputs the first further buffered version as a buffered version of the second incoming signal.

21. The buffer circuit of claim 20, wherein the first further circuit receives the second further buffered version from a second further circuit of the one or more further circuits, the second further buffered version outputting the second further buffered version as a buffered version of a third incoming signal of the one or more further incoming signals, the third incoming signal being out of phase with the first incoming signal.

22. The buffer circuit of claim 21, further comprising:
    a local oscillator generator receiving as input an original signal and producing as output a first pair of differential signals and a second pair of differential signals, the first pair of differential signals comprising the first incoming signal and the third incoming signal and the second pair of differential signals comprising the second incoming signal and a fourth incoming signal, wherein the first incoming signal is in phase with the original signal and the second incoming signal is in quadrature with the original signal.

23. The buffer circuit of claim 1, wherein the first incoming signal is an in-phase version of an original signal and a second incoming signal of the one or more further incoming signals is a quadrature version of the original signal.

24. The buffer circuit of claim 1, wherein the first circuit further comprises an inverter coupled to the second of the inputs of the first circuit, the inverter being arranged to produce the first buffered version that is in phase with the first incoming signal from a signal that is out of phase with the first incoming signal.

25. The buffer circuit of claim 8, wherein the first circuit further comprises an inverter coupled to the second of the inputs of the first circuit, the inverter being arranged to produce the first buffered version that is in phase with the first incoming signal from a signal that is out of phase with the first incoming signal.

26. A circuit comprising:
a first buffer circuit having a first output, the first buffer circuit being arranged to produce at the first output, upon receiving a first incoming signal and a second buffered signal that is in phase with the first incoming signal, a first buffered signal that is a buffered version of the first incoming signal; and
a second buffer circuit having a second output, the second buffer circuit being arranged to produce at the second output, upon receiving a second incoming signal that is in quadrature with the first incoming signal and a third buffered signal that is in phase with the second incoming signal, the second buffered signal that is a buffered version of a second incoming signal.

27. The circuit of claim 26, wherein the first buffer circuit is arranged to produce at the first output the first buffered signal that is in quadrature with the first incoming signal, and
wherein the second buffer circuit is arranged to produce at the second output the second buffered signal that is in quadrature with the second incoming signal.

28. The circuit of claim 26, wherein the first buffer circuit comprises a push-pull circuit having two inputs, a first of the two inputs being arranged to receive the first incoming signal and a second of the two inputs being arranged to receive the second buffered signal.

29. The circuit of claim 28, wherein the push-pull circuit comprises a first transistor and a second transistor, a first gate of the first transistor being arranged to receive the first incoming signal and a second gate of the second transistor being arranged to receive the second buffered signal.

30. The circuit of claim 26, further comprising:
a local oscillator generator to receive as input an original signal and to produce as output a first pair of differential signals and a second pair of differential signals, the first pair of differential signals comprising the first incoming signal and a third incoming signal that is a negative version of the first incoming signal and the second pair of differential signals comprising the second incoming signal and a fourth incoming signal that is a negative version of the second incoming signal, wherein the local oscillator generator produces the first incoming signal in phase with the original signal and produces the second incoming signal in quadrature with the original signal.

31. The circuit of claim 30, further comprising:
a third buffer circuit having a third output, the third buffer signal being arranged to produce at the third output, upon receiving the third incoming signal and a fourth buffered signal that is in phase with the third incoming signal, the third buffered signal that is a buffered version of the third incoming signal;
a fourth buffer circuit having a second output, the second buffer circuit being arranged to produce at the fourth output, upon receiving the fourth incoming signal and the first buffered signal that is in phase with the fourth incoming signal, the fourth buffered signal that is a buffered version of the fourth incoming signal; and
a mixer to receive the first buffer signal, second buffer signal, third buffer signal, and fourth buffer signal and to produce radio frequency (RF) signals and/or intermediate frequency (IF) based at least in part on the first buffer signal, second buffer signal, third buffer signal, and fourth buffer signal.

32. The circuit of claim 25, further comprising:
an inverter to produce the second buffered signal that is in phase with the first incoming signal from a signal that is out of phase with the first incoming signal.

33. A circuit comprising:
a first input terminal;
a second input terminal;
an output terminal;
a first transistor having a first conduction terminal to couple to a supply voltage and a second conduction terminal to couple to the output terminal, the first transistor further comprising a first control terminal coupled to the first input terminal;
a second transistor having a third conduction terminal to couple to the second conduction terminal and the output terminal and a fourth conduction terminal to couple to ground, the second transistor having a second control terminal coupled to the second input terminal,
wherein the circuit is arranged such that, when a first incoming signal is applied to the second control terminal and a second incoming signal that is in phase with the first incoming signal is applied to the first control terminal, the circuit produces at the output terminal a buffered version of the first incoming signal.

34. The circuit of claim 33, wherein the circuit is arranged such that the circuit produces at the output terminal the buffered version that is in quadrature with the first incoming signal.

35. The circuit of claim 33, further comprising:
a capacitor to couple between the second conduction terminal, the third conduction terminal, and the output terminal and ground.

36. The circuit of claim 33, wherein the first transistor is a PMOS transistor and the first control terminal is a gate of the PMOS transistor, and
wherein the second transistor is an NMOS transistor and the second control terminal is a gate of the NMOS transistor.

37. The circuit of claim 33, further comprising:
a inverter coupled between the first input terminal and the first control terminal.

* * * * *